United States Patent
Kuenle et al.

(10) Patent No.: US 9,984,915 B2
(45) Date of Patent: May 29, 2018

(54) SEMICONDUCTOR WAFER AND METHOD FOR PROCESSING A SEMICONDUCTOR WAFER

(71) Applicant: Infineon Technologies AG, Neubiberg (DE)

(72) Inventors: Matthias Kuenle, Villach (AT); Gerhard Schmidt, Wernberg (AT); Martin Sporn, Villach (AT); Markus Kahn, Rangersdorf (AT); Juergen Steinbrenner, Noetsch (AT); Ravi Joshi, Villach (AT)

(73) Assignee: Infineon Technologies AG, Neubiberg (DE)

( * ) Notice: Subject to any disclaimer, the term of this patent is extended or adjusted under 35 U.S.C. 154(b) by 422 days.

(21) Appl. No.: 14/291,107

(22) Filed: May 30, 2014

(65) Prior Publication Data
US 2015/0348824 A1    Dec. 3, 2015

(51) Int. Cl.
*H01L 21/762* (2006.01)
*H01L 29/06* (2006.01)
(Continued)

(52) U.S. Cl.
CPC ........ *H01L 21/762* (2013.01); *C23C 14/0605* (2013.01); *C23C 14/345* (2013.01);
(Continued)

(58) Field of Classification Search
CPC . H01L 45/149; H01L 21/02444; H01L 21/78; H01L 21/82; H01L 21/02376;
(Continued)

(56) References Cited

U.S. PATENT DOCUMENTS

| 6,086,730 A | * | 7/2000 | Liu | ...................... C23C 14/0605 |
| | | | | 204/192.12 |
| 6,421,195 B1 | * | 7/2002 | Rubin | .................... B82Y 10/00 |
| | | | | 360/135 |

(Continued)

FOREIGN PATENT DOCUMENTS

| EP | 2587518 A1 | 5/2013 |
| WO | 2008101704 A2 | 8/2008 |

OTHER PUBLICATIONS

E. Oks, A. Anders, Evolution of the plasma composition of a higher power impulse magnetron sputtering system studied with a time-of-flight spectrometer, Journal of Applied Physics 105, 2009, 093304-1-093304-9.

(Continued)

*Primary Examiner* — Caridad Everhart
(74) *Attorney, Agent, or Firm* — Viering, Jentschura & Partner MBB (57) ABSTRACT

According to various embodiments, a semiconductor wafer may include: a semiconductor body including an integrated circuit structure; and at least one tetrahedral amorphous carbon layer formed at least one of over or in the integrated circuit structure, the at least one tetrahedral amorphous carbon layer may include a substance amount fraction of $sp^3$-hybridized carbon of larger than approximately 0.4 and a substance amount fraction of hydrogen smaller than approximately 0.1.

9 Claims, 5 Drawing Sheets

(51) Int. Cl.
*C23C 14/06* (2006.01)
*C23C 14/34* (2006.01)
*H01L 29/40* (2006.01)
*C23C 14/58* (2006.01)
*C23C 14/35* (2006.01)
*H01L 29/16* (2006.01)
*H01L 21/02* (2006.01)
*H01L 29/73* (2006.01)

(52) U.S. Cl.
CPC .......... *C23C 14/35* (2013.01); *C23C 14/5806* (2013.01); *H01L 21/02527* (2013.01); *H01L 21/02631* (2013.01); *H01L 29/0649* (2013.01); *H01L 29/0657* (2013.01); *H01L 29/16* (2013.01); *H01L 29/408* (2013.01); *H01L 29/73* (2013.01)

(58) Field of Classification Search
CPC ......... H01L 21/02527; H01L 21/02631; H01L 21/3146; H01L 45/1625; H01L 21/762; H01L 29/0657; H01L 29/73; H01L 29/408; H01L 29/0649; H01L 29/16; C23C 14/5806; C23C 14/35; C23C 29/16; C23C 14/345; C23C 14/0605
USPC .................................. 438/761, 762, 778, 780
See application file for complete search history.

(56) References Cited

U.S. PATENT DOCUMENTS

| | | | | |
|---|---|---|---|---|
| 2008/0303068 | A1* | 12/2008 | Grill | H01L 21/823807 257/288 |
| 2009/0309180 | A1* | 12/2009 | Yamagata | G06K 9/0002 257/435 |
| 2011/0122486 | A1 | 5/2011 | Busch et al. | |
| 2013/0058640 | A1* | 3/2013 | Taki | C23C 14/0605 396/531 |
| 2013/0146443 | A1* | 6/2013 | Papa | C23C 14/35 204/192.16 |
| 2014/0102888 | A1* | 4/2014 | Harkness, IV | C23C 14/352 204/298.03 |
| 2014/0127902 | A1* | 5/2014 | Zhao | H01L 21/76843 438/653 |

OTHER PUBLICATIONS

W.D. Muenz, M. Schenkel, S. Kunkel, J. Paulitsch, K. Bewilogua, Industrial applications of HIPIMS, Journal of Physics: Conference Series 100, 2008, 082001-1-82001-6.

L.A. Donohue, A. Torosyan, P. May, D.E. Wolfe, J. Kulik, T.J. Eden, Investigation of PVD-DLC Thin Films Manufactured Using HIPIMS Etch/Unbalanced Magnetron Sputter (UBM) Deposition and Secondary Mechano-chemical Modification, Plating & Surface Finishing, 2009, pp. 38-46.

J. Robertson, Diamond-like Amorphous carbon, Materials Science and Engineering, R37, 2002, pp. 129-281.

K. Sarakinos et al., Exploring the potential of high power impulse magnetron sputtering for growth of diamond-like carbon films, Surface & Coatings Technology (2011).

B.M. DeKoven et al., Carbon Thin Film Deposition Using High Power Pulsed Magnetron Sputtering, Society of Vacuum Coaters 505/856-7188, 46th Annual Technical Conference Proceedings (2003), pp. 158-165.

Verein Deutscher Ingenieure, "Kohlenstoffschichten—Grundlagen, Schichttypen and Eigenschaften (Carbon films—Basic knowledge, film types and properties)", VDI 2840, Jun. 2012, first 5 pages with English translation.

* cited by examiner

SEMICONDUCTOR WAFER AND METHOD FOR PROCESSING A SEMICONDUCTOR WAFER

TECHNICAL FIELD

Various embodiments relate generally to a semiconductor wafer and a method for processing a semiconductor wafer.

BACKGROUND

In general, there may be various methods in semiconductor industry for forming one or more layers over a wafer or over a semiconductor carrier, e.g. during manufacture of a die, a chip, or an integrated circuit. The specific demands on the properties (e.g. chemical or physical properties, as for example specific electrical conductivity, hardness, chemical composition, microstructure, surface roughness) of the one or more layers to be formed over the wafer may be specified by the desired functionality of the layers itself or may be specified by the specific function of the layers provided within an electronic structure. The properties of the layers formed over a carrier in semiconductor technology may be brought consistent with the effort, the costs and benefits. A variety of different layers, materials, and deposition methods may be used in semiconductor processing. However, due to the complexity of the layer manufacturing processes they cannot be easily transferred from one process to another process.

Currently, highly ionized pulse plasma (HIPP) processes, e.g. high power impulse magnetron sputtering (HiPIMS), high power pulse magnetron sputtering (HPPMS), modulated pulse power sputtering (MPP), or other highly ionized deposition methods (HIS, highly ionized sputtering), e.g. cathodic arc deposition, may be currently used for depositing thin films or layers.

SUMMARY

According to various embodiments, a semiconductor wafer may include: a semiconductor body including an integrated circuit structure, and at least one tetrahedral amorphous carbon layer formed at least one of over or in the integrated circuit structure. The at least one tetrahedral amorphous carbon layer may include a substance amount fraction of $sp^3$-hybridized carbon of larger than approximately 0.4 and a substance amount fraction of hydrogen smaller than approximately 0.1.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

In general, amorphous carbon (a-C) does not have an ordered (long range ordered) crystalline structure and is also referred to as diamond-like carbon (DLC). In DLC layers, the carbon atoms may be connected to adjacent carbon atoms or hydrogen atoms (in a short range order) forming either an $sp^2$-hybridized bonding structure (three $sp^2$-orbitals are oriented in a plane symmetrical to each other (with a trigonal symmetry)) or an $sp^3$-hybridized bonding structure (four $sp^3$-orbitals are tetrahedrally aligned equiangularly to each other). However, in amorphous carbon layers the short-range order may be disturbed, e.g. the C-rings may be "warped" or disordered, which may have an impact to the Raman spectra (e.g. a D-peak, or a peak broadening).

Figure 1:
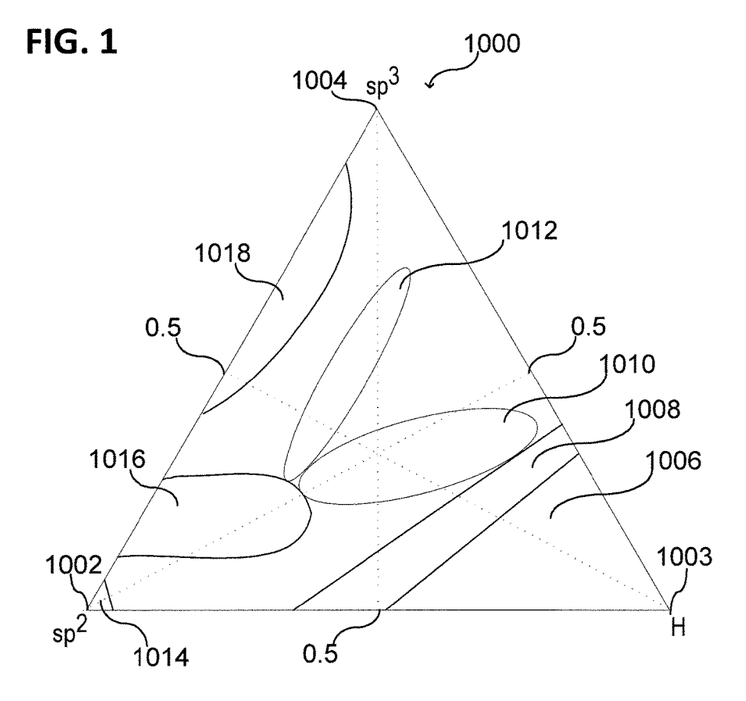
FIG. 1 shows a ternary phase diagram including $sp^2$-hybridized carbon, $sp^3$-hybridized carbon, and hydrogen.

FIG. 1 shows various modifications of diamond like carbon (DLC) layers in a ternary phase diagram 1000, where pure carbon phases (in a first corner and a second corner of the ternary phase diagram 1000) are the $sp^2$-hybridized carbon 1002 (e.g. the graphite phase of carbon, e.g. distorted or disordered graphite) and the $sp^3$-hybridized carbon 1004 (e.g. the diamond phase of carbon, e.g. distorted or disordered diamond, e.g. distorted or disordered nanocrystalline diamond). Further, the DLC layers may include hydrogen 1003 (in a third corner of the ternary phase diagram 1000). Besides a region 1006 of compositions forming no layers or being not accessible by means of layering processes (thin film deposition processes, as for example physical vapor deposition PVD and/or chemical vapor deposition CVD), the ternary phase diagram 1000 illustrates a plurality of mixed DLC phases, as for example: (condensed) hydrocarbons 1008; hydrogenated amorphous carbon 1010 (a-C:H); sputtered amorphous carbon 1016 (a-C); sputtered hydrogenated amorphous carbon 1016 (a-C:H); hydrogenated tetrahedral amorphous carbon 1012 (ta-C:H); glassy carbon 1014 and/or graphitic carbon 1014; or tetrahedral amorphous carbon 1018 (ta-C).

As illustrated in and described referring to FIG. 1, hydrocarbons 1008, e.g. polyethylene (PE) or e.g. polyacetylene (PAC), may include for example more than 65 at-% (atomic percent) of hydrogen. Further, the carbon of hydrocarbons 1008 may be for example completely $sp^3$-hybridized. Accordingly, hydrocarbon layers may have for example a density (e.g. mass density) of smaller than about 1 g/cm$^3$ and a hardness (e.g. Vickers hardness) of about 0.01 GPa.

As illustrated in and described referring to FIG. 1, hydrogenated amorphous carbon 1010 (a-C:H) may include for example a substance amount fraction of hydrogen in the range from about 20% to about 60%. Further, hydrogenated amorphous carbon 1010 (a-C:H) may include for example a substance amount fraction of $sp^3$-hybridized carbon in the range from about 20% to about 40%. Accordingly, hydrogenated amorphous carbon (a-C:H) layers may have for example a density (e.g. mass density) in the range from about 1.2 g/cm$^3$ to about 2.2 g/cm$^3$ and a hardness (e.g. Vickers hardness) of smaller than about 20 GPa.

As illustrated in and described referring to FIG. 1, conventionally sputtered amorphous carbon 1016 (a-C) or conventionally sputtered hydrogenated amorphous carbon 1016 (a-C:H) may include for example a substance amount fraction of hydrogen in the range from about 0% to about 30%. Further, conventionally sputtered amorphous carbon 1016 (a-C) or conventionally sputtered hydrogenated amorphous carbon 1016 (a-C:H) may include for example a substance amount fraction of $sp^3$-hybridized carbon in the range from about 5% to about 30%. Accordingly, conventionally sputtered amorphous carbon (a-C) layers or conventionally sputtered hydrogenated amorphous carbon (a-C:H) layers may have for example a density (e.g. mass density) in the range from about 1.6 g/cm$^3$ to about 2.2 g/cm$^3$ and a hardness (e.g. Vickers hardness) of less than about 20 GPa. These properties may refer to conventionally sputtered DLC layers which can be deposited via a standard magnetron sputtering process.

As illustrated in and described referring to FIG. 1, hydrogenated tetrahedral amorphous carbon 1012 (ta-C:H) may include for example a substance amount fraction of hydrogen in the range from about 20% to about 30%. Further, hydrogenated tetrahedral amorphous carbon 1012 (ta-C:H) may include for example a substance amount fraction of $sp^3$-hybridized carbon in the range from about 20% to about 60%. Accordingly, hydrogenated tetrahedral amorphous carbon (ta-C:H) layers may have for example a density (e.g. mass density) of about 2.4 g/cm$^3$ and a hardness (e.g. Vickers hardness) of less than about 50 GPa.

Further evaporated carbon and glassy carbon may be graphite like and may include for example a substance amount fraction of $sp^3$-hybridized carbon of smaller than about 5%.

As illustrated in and described referring to FIG. 1, tetrahedral amorphous carbon 1018 (ta-C) may include for example a substance amount fraction of hydrogen of smaller than about 10%, e.g. smaller than about 8%, e.g. smaller than about 5%. Further, tetrahedral amorphous carbon 1018 (ta-C) may include for example a substance amount fraction of $sp^3$-hybridized carbon in the range from about 40% to about 90%. Accordingly, tetrahedral amorphous carbon (ta-C) layers may have for example a density (e.g. mass density) in the range from about 2.8 g/cm$^3$ to about 3.1 g/cm$^3$ and a hardness (e.g. Vickers hardness) of larger than about 50 GPa.

Commonly used methods in semiconductor industry, as for example low pressure chemical vapor deposited (LP-CVD) may allow depositing (forming) carbon films or carbon layers which are graphite-like. These graphite-like carbon layers may be high temperature stable. Other commonly used methods in semiconductor industry, as for example plasma enhanced chemical vapor deposition (PE-CVD), may allow depositing carbon films which are diamond-like, but due to the incorporation of hydrogen during the deposition process (e.g. stemming from the precursor gases) their temperature stability is comparably low, since hydrogen may effuse at elevated temperatures of 350° C. and the amorphous carbon layer may collapse by a transformation of the carbon hybridization towards $sp^2$.

Illustratively, commonly applied carbon deposition methods in semiconductor industry may only allow manufacturing a-C layers, having either a comparatively high amount of hydrogen or a graphite-like character with a comparatively small amount of $sp^3$-hybridized carbon.

Illustratively, one aspect of various embodiments may include providing an amorphous carbon layer in a semiconductor processing which has a high hardness and/or a high temperature stability. Various embodiments may be based on the knowledge that annealing processes or thermal treatments during the manufacture of an integrated circuit on wafer-level may cause a degradation of amorphous carbon layers deposited via commonly used deposition processes. Various embodiments may be based on the knowledge that commonly used amorphous carbon layers on a wafer may be either prone to errors during a thermal treatment or may have a low hardness and/or a low density, which may result for example in insufficient behavior during chemical mechanical polishing (CMP). Further, various embodiments may be based on the knowledge that using highly ionized sputtering (HIS) may allow tuning the properties of diamond-like carbon (DLC) layers in the entire range of the ternary phase diagram 1000. Further, various embodiments are based on the knowledge that using highly ionized sputtering (HIS) may allow forming diamond-like carbon (DLC) layers having a high density and/or a high hardness. Further, various embodiments are based on the knowledge that using highly ionized sputtering (HIS) may allow forming high temperature stable diamond-like carbon (DLC) layers acting as diffusion bather or electrically isolating layer.

According to various embodiments, as described herein, ta-C layers (tetrahedral or tetrahedral amorphous carbon layers) may be created by HIS. As already described, these layers may include an amorphous network of $sp^2$- and $sp^3$-hybridized carbon with a high amount of carbon in $sp^3$ hybridization, wherein, at the same time, these ta-C layers have a low hydrogen content, e.g. a low substance amount fraction (atomic percent or atomic percentage), e.g. smaller than 10%, e.g. smaller than 5%, e.g. smaller than 1%.

According to various embodiments, highly ionized sputtering (HIS) may allow to deposit diamond-like carbon films with excellent high temperature stability due to no or only very low hydrogen content. The HIS process may be performed using at least one carbon target, wherein the carbon target may include almost no hydrogen (e.g. smaller than for example one mass percent). According to various embodiments, the high temperature stability of diamond-like carbon layers sputtered with HIS may allow integrating these layers in semiconductor processing in a semiconductor fab, where typical front end of line (FEOL) process flows may include frequent and subsequent anneal steps up to 1100° C. or other processes at elevated temperatures, e.g. in CMOS technology.

In contrast thereto, currently available deposition methods for authentic ta-C may be pulsed laser deposition (PLD) and filtered cathodic vacuum arc (FCVA) deposition. These methods may not be suitable for use in semiconductor production for the following reasons, for example: PLD and FCVA may be restricted to small sample sizes and may not allow mass production; moreover, these methods are prone for defects like droplets and particulates in the deposited films which may reduce the functionality of small electronic structures to be typically produced in semiconductor industry.

As mentioned before PE-CVD carbon films may contain hydrogen and thus their temperature stability may be comparably low and therefore insufficient for high temperature processes in semiconductor technology.

According to various embodiments, one or more DLC layers may be formed on a semiconductor wafer by employing a sputtering process configured to provide a high content of ionized carbon atoms (HIS) being sputtered from a carbon target of high purity. According to various embodiments, highly ionized magnetron sputtering may enable the deposition of DLC films or DLC layers of high purity and good thickness uniformity at high deposition rates.

In conventional DC (directed current) sputtering substantially neutral carbon atoms may be ejected (sputtered) from the target, e.g. without generating a significant content of ionized carbon atoms, and the kinetic energies of the sputtered carbon atoms may be in the range of the condensation energies (e.g. in the range from about 1 eV to about 5 eV). In the HIS process, a pulse of high energy (in the range from about several hundreds of kilowatts to about several megawatts) is released on the carbon target. A significant amount of sputtered carbon atoms is ionized and can be accelerated towards the substrate by applying a negative bias voltage or drift voltage for the ions (e.g. a negative RF voltage, wherein the RF voltage oscillates around a constant negative level). The acceleration of the sputtered carbon ions may be used for directional sputtering or for applying tunable kinetic ion energy to the growing film in addition to the condensation energy. The deposition process may provide an access to different film properties from those generated by conventional DC sputtering. DLC layers formed via HIS may be used as hard and dense coatings, e.g. with an additional high temperature stability. Further, according to various embodiments, using HIS may allow influencing and/or adapting the carbon state of hybridization in the deposited DLC layers.

During the conventional sputtering process (e.g. conventional AC or DC magnetron sputtering), due to little ionization energy, graphitized carbon films are deposited. In contrast thereto, according to various embodiments, employing the high energy process, HIS, may allow to shift the hybridization regime from $sp^2$-state to $sp^3$-state. According to various embodiments, the hardness of DLC films deposited via HIS may be larger than about 50 GPa or larger than about 60 GPa, or e.g. in the range from about 40 GPa to about 60 GPa, wherein the DLC films deposited via HIS may be $sp^3$ rich.

According to various embodiments, the $sp^3$ content of the deposited DLC films or layers (e.g. deposited via high power impulse magnetron sputtering) may be evaluated for example based on their visible and ultraviolet (UV) Raman spectra. Additionally, the evaluation of the structural class of the DLC films or layers (e.g. ta-C) may be possible via their ultraviolet (UV) Raman spectra, e.g. by the presence of the so-called T-peak in their UV-Raman spectra.

In general, HIS or HiPIMS deposited carbon films may be in the tool-coating community used due to their high hardness. However, various embodiments may base on the insight that these deposition techniques may allow forming high temperature stable DLC layers for integrating DLC layer into semiconductor processing or into the manufacture of electronic circuits on wafer-level.

Commonly used methods such as PE-CVD or ion-beam deposited carbon films may include hydrogen due to the usage of hydrocarbon precursors, and, according to various embodiments, it has been recognized that highly ionized magnetron sputtering starting from a pure carbon target as solid material source may enable the deposition of almost hydrogen free DLC films. As a result, highly ionized magnetron sputtering may allow deposition different types of DLC layers (cf. the ternary phase diagram in FIG. 1) via the very same deposition tool (sputtering system), e.g. via controlling the energy and an defined introduction of hydrogen into the layers.

According to various embodiments, highly ionized magnetron sputtering may allow forming ta-C (substantially hydrogen free) layers which may be stable after deposition up to 1000° C. or up to 1100° C. In contrast, for example, hydrogenated amorphous carbon (a-C:H) layers may degrade at temperatures larger than about 350° C.

However, according to various embodiments, the highly ionized magnetron sputtering may be operated in a reactive mode. Reactive HIS may enable the deposition of hydrogenated tetrahedral amorphous carbon (ta-C:H) layers; and therefore, HIS may enable the tuning of the carbon hybridization state as shown in the ternary phase diagram (i.e. along the $sp^2$-$sp^3$ axis) and reactive HIS may further enable tuning the hydrogen content so that all the phases in the ternary phase diagram including ta-C can be accessed by HIS and reactive HIS. Tuning the hydrogen content may add a further degree of freedom of the HIS method additional to the possibility to form the substantially hydrogen free carbon modification ta-C. Further, HIS may enable ease of material engineering, as for example metal doping or alloying by use of segmented, pressed or sintered targets; reactive sputtering by use of process gases different from noble gases. Further, the edge coverage of the DLC layers deposited via HIS may be enhanced compared to conventionally sputtered carbon films, or in other words, HIS may allow forming a DLC layer conformally covering one or more structure elements on a wafer.

According to various embodiments, carbon may be used as target material for a HIS process in a semiconductor production (e.g. in a fab and its typical process flows) for depositing ta-C films. A HIS generated diamond-like carbon material with a higher thermal stability in comparison to PE-CVD carbon films, makes the material suitable for a integration in front end of line (FEOL) processes with subsequent higher annealing temperatures and processes, e.g. from about 400° C. to about 1200° C., e.g. from about 500° C. to about 1100° C., e.g. from about 600° C. to about 1000° C.

According to various embodiments, a DLC layer (e.g. ta-C) formed via HIS may be used as a stopping layer for a chemical mechanical polishing process (a CMP process) formed in FEOL processing in semiconductor industry, e.g. due to the high hardness of the DLC layer.

According to various embodiments, a DLC layer (e.g. ta-C) formed via HIS may be used as a bather layer or diffusion bather layer formed in FEOL processing in semiconductor industry, e.g. due to the high density and the amorphous crystal structure of the DLC layer.

According to various embodiments, a DLC layer (e.g. an undoped ta-C layer or a silicon doped ta-C layer) formed via HIS may be used as electrical passivation layer, dielectric layer or isolating layer formed in FEOL processing in semiconductor industry, e.g. due to the low specific electrical conductivity.

According to various embodiments, a doped DLC layer (e.g. a metal doped ta-C layer) formed via HIS may be used as electrically conductive layer formed in FEOL processing in semiconductor industry.

According to various embodiments, a DLC layer (e.g. a ta-C layer) formed via HIS may be used as heat transport layer or heat sink layer formed in FEOL processing in semiconductor industry, e.g. due to the high thermal conductivity.

According to various embodiments, a DLC layer (e.g. a ta-C layer) formed via HIS may be used as anti-reflective coating formed or used in FEOL processing in semiconductor industry, e.g. due to the high optical refractive index.

According to various embodiments, the properties of the DLC layer (e.g. a ta-C layer) formed via HIS, as described before, may be compared with the properties of commonly used DLC layers, e.g. formed via conventional sputtering processes or CVD processes.

According to various embodiments, a highly ionized sputtering process may be kinetically controlled, whereas conventional sputtering processes or CVD processes may be temperature controlled or chemically controlled. Further, methods to identify the properties of a DLC film may be X-ray photoelectron spectroscopy (XPS) or electron energy loss spectroscopy (EELS) for the bonding state of carbon atoms and high-resolution transmission electron microscopy (HRTEM) for the crystallographic structure.

It should be noted, that films being deposited via arc evaporation, filtered cathodic vacuum arc (FCVA) deposition, or PLD may have a higher defect density than films being deposited via highly ionized sputtering, which may cause problems in semiconductor processing (e.g. the manufacture of chips or integrated circuits) involving small feature sizes down to 100 nm or even smaller.

Figure 2A:
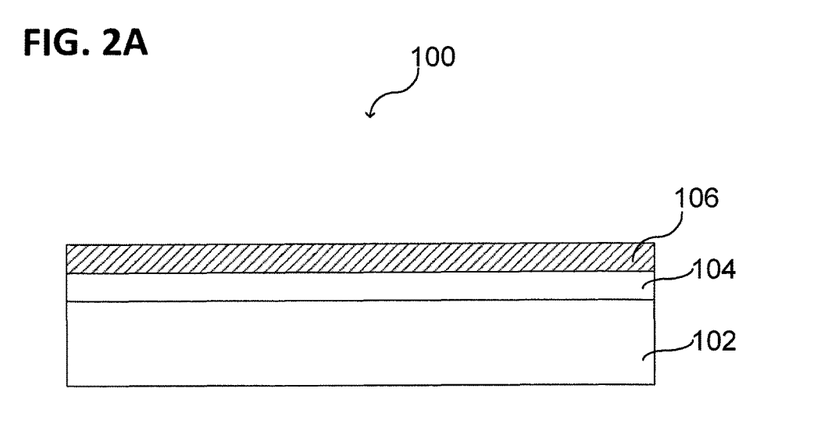
FIGS. 2A to 2C show respectively a schematic view of a semiconductor carrier including at least one integrated circuit structure at least one tetrahedral amorphous carbon layer, according to various embodiments.

FIG. 2A illustrates a semiconductor wafer 100, according to various embodiments, wherein the semiconductor wafer 100 may include: a semiconductor body 102, an integrated circuit structure 104; and at least one tetrahedral amorphous carbon layer 106 formed at least one of over or in the integrated circuit structure 104. According to various embodiments, the at least one tetrahedral amorphous carbon layer 106 may include a substance amount fraction of $sp^3$-hybridized carbon of larger than approximately 0.4 (40%) and a substance amount fraction of hydrogen smaller than approximately 0.1 (10%).

According to various embodiments, the semiconductor body 102 may include at least one semiconducting material, e.g. silicon, germanium, gallium, arsenic, gallium arsenide, and the like. In other words, the semiconductor wafer 100 and/or the semiconductor body 102 may be made of semiconductor materials of various types, including silicon, germanium, Group III to V or other types, including polymers, for example, although in another embodiment, other suitable materials can also be used. In an embodiment, the semiconductor wafer 100 and/or the semiconductor body 102 may be made of silicon (doped or undoped), in an alternative embodiment, the semiconductor wafer 100 and/or the semiconductor body 102 may be a silicon on insulator (SOI) wafer. As an alternative, any other suitable semiconductor materials can be used for the semiconductor wafer 100 and/or the semiconductor body 102, for example semiconductor compound material such as gallium arsenide (GaAs), indium phosphide (InP), but also any suitable ternary semiconductor compound material or quaternary semiconductor compound material such as indium gallium arsenide (InGaAs).

According to various embodiments, the semiconductor body 102 may include an integrated circuit structure 104 or an integrated circuit structure 104 may be disposed over the semiconductor body 102. According to various embodiments, the semiconductor body 102 and/or the integrated circuit structure 104 may include at least one of a p-well region and an n-well region (or p-doped region and an n-doped region), and further, the semiconductor body 102 and/or the integrated circuit structure 104 may be doped or may include a doped region, e.g. at least one of n-doped and p-doped region. According to various embodiments, the semiconductor body 102 and/or the integrated circuit structure 104 may include a transistor, e.g. a field effect transistor, e.g. a bipolar transistor. According to various embodiments, the semiconductor body 102 and/or the integrated circuit structure 104 may include at least a part of a high-voltage device, a sensor, e.g. a hall sensor, e.g. a strain sensor, a diode, an electrostatic discharge protection device, an electrostatic discharge protection diode, and the like.

According to various embodiments, the semiconductor body 102 and/or the integrated circuit structure 104 structure may include at least one of the following: a readily processed integrated circuit, a CMOS integrated circuit, a bipolar transistor, an IGBT, and/or a micro-electro-mechanical system (MEMS), or another component or another structure, as for example, a chip, a memory chip, a die, a microprocessor, a microcontroller, a memory structure, a charge storage memory, a random access memory, a dynamic random access memory, a logic circuit, a sensor, a nano-sensor, an integrated transceiver, a micro-mechanical device, a micro-electronic device, a nano-electronic device, an electrical circuit, a digital circuit, an analog circuit, and any other electronic device based on semiconductor technology.

According to various embodiments, the at least one tetrahedral amorphous carbon layer 106 may include a substance amount fraction (at-%) of $sp^3$-hybridized carbon in the range from about 0.4 (40%) to about 0.95 (95%), e.g. in the range from about 0.4 (40%) to about 0.90 (90%), e.g. in the range from about 0.5 (50%) to about 0.95 (95%), e.g. in the range from about 0.6 (60%) to about 0.95 (95%), e.g. in the range from about 0.7 (70%) to about 0.95 (95%), e.g. in the range from about 0.7 (70%) to about 0.85 (85%) and a substance amount fraction of hydrogen in the range from about 0.001 (0.1%) to about 0.10 (10%), e.g. in the range from about 0.01 (1%) to about 0.10 (10%), e.g. in the range from about 0.01 (1%) to about 0.05 (5%). According to various embodiments, since the tetrahedral amorphous carbon layer 106 may include a substance amount fraction of hydrogen of smaller than about 0.10 (10%), the amorphous carbon layer 106 may be high temperature stable, e.g. in a temperature range from about 400° C. to about 1400° C., e.g. in the range from about 500° C. to about 1200° C., e.g. in the range from about 600° C. to about 1100° C., e.g. in the range from about 600° C. to about 1000° C.

Therefore, it may be possible to integrate the tetrahedral amorphous carbon layer 106 into the electronic structure on the semiconductor wafer.

Figure 2B:
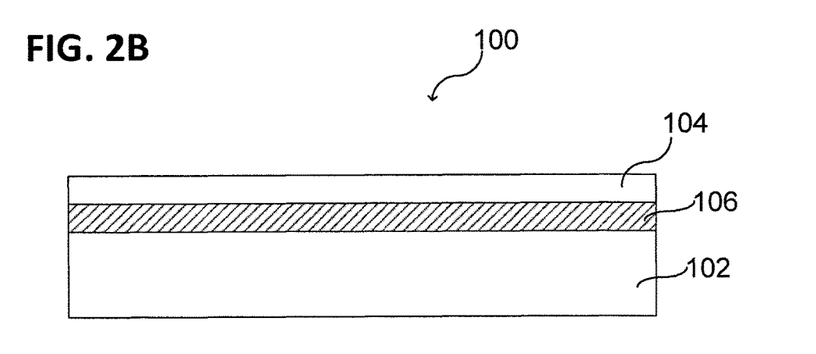

As illustrated in FIG. 2B, according to various embodiments, the tetrahedral amorphous carbon layer 106 may be disposed (at least partially) between the semiconductor body 102 and the integrated circuit structure 104. According to various embodiments, the processing of the integrated circuit structure 104 may not be limited by the tetrahedral amorphous carbon layer 106, since the tetrahedral amorphous carbon layer 106 is chemically, thermally, and/or mechanically stable. The tetrahedral amorphous carbon layer 106 may act as a diffusion bather between the integrated circuit structure 104 and the semiconductor body 102.

Figure 2C:
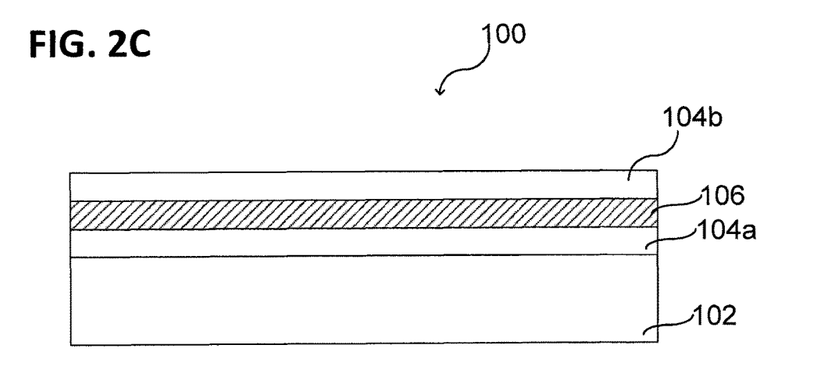

As illustrated in FIG. 2C, according to various embodiments, the tetrahedral amorphous carbon layer 106 may be disposed (at least partially) between a first region 104a of the integrated circuit structure 104 and a second region 104b of the integrated circuit structure 104. Thereby, the tetrahedral amorphous carbon layer 106 may act for example as at least one of: a diffusion barrier, an electrically isolating structure, a heat sink layer. Further, according to various embodiments, the tetrahedral amorphous carbon layer 106 may be doped with a metal to be electrically conductive. Therefore, the HIS process may be performed using a doped carbon target.

Figure 2D:
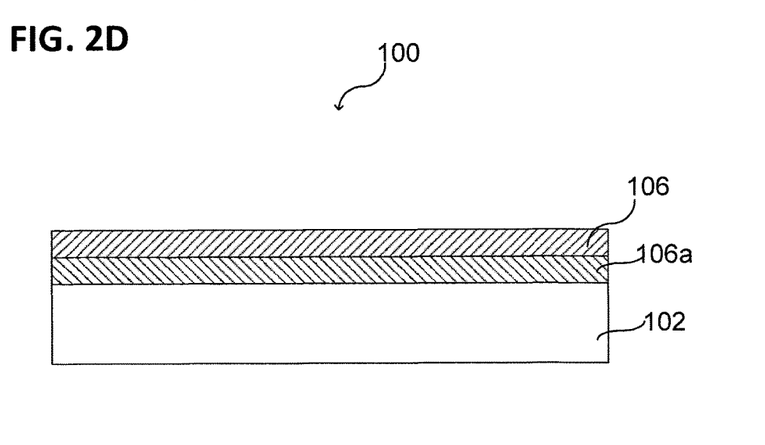
FIG. 2D shows a schematic view of a semiconductor carrier including more than one amorphous carbon layer, according to various embodiments.

FIG. 2D illustrates a semiconductor wafer 100, according to various embodiments, wherein the semiconductor wafer 100 may include a first carbon layer 106 and a second carbon layer 106a, or in other words, semiconductor wafer 100 may include a tetrahedral amorphous carbon layer 106, as described before, and at least on additional carbon layer 106a. Thereby, at least on carbon layer, of the at least two carbon layers 106, 106a may include a substance amount fraction (at-%) of $sp^3$-hybridized carbon in the range from about 0.4 (40%) to about 0.95 (95%), e.g. in the range from about 0.4 (40%) to about 0.90 (90%), e.g. in the range from about 0.5 (50%) to about 0.95 (95%), e.g. in the range from about 0.6 (60%) to about 0.95 (95%), e.g. in the range from about 0.7 (70%) to about 0.95 (95%), e.g. in the range from about 0.7 (70%) to about 0.85 (85%) and a substance amount fraction of hydrogen in the range from about 0.001 (0.1%) to about 0.10 (10%), e.g. in the range from about 0.01 (1%) to about 0.10 (10%), e.g. in the range from about 0.01 (1%) to about 0.05 (5%), wherein the other carbon layer of the at least two carbon layers 106, 106a may include a different DLC.

Illustratively, a first carbon layer disposed over the semiconductor body 102 may be a tetrahedral amorphous carbon layer 106, wherein a second carbon layer disposed over the semiconductor body 102 may include any other type of DLC layer, as for example described referring to FIG. 1.

According to various embodiments, the semiconductor wafer 100 may include a layer stack including a plurality of carbon layer with different properties, which may allow for example stress engineering or functional layer stacks, wherein at least one of the carbon layers of the layer stack may include ta-C with a small amount of hydrogen, as described before.

Figure 2E:
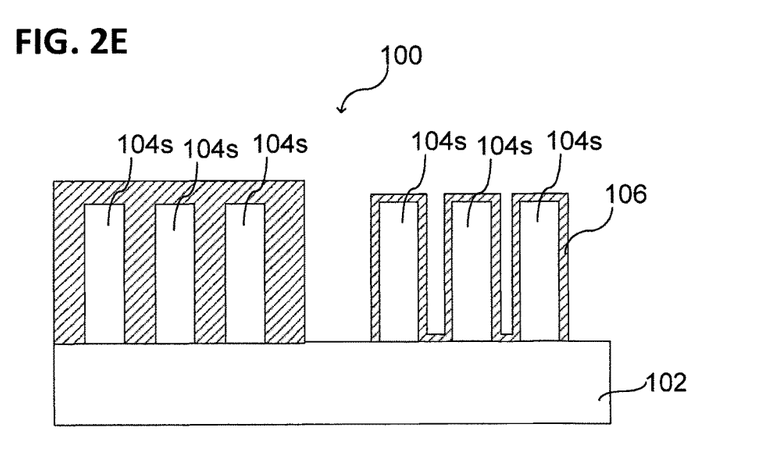
FIG. 2E shows a schematic view of a semiconductor carrier including a plurality of integrated circuit structure elements and at least one tetrahedral amorphous carbon layer disposed over the integrated circuit structure elements, according to various embodiments.

FIG. 2E illustrates a semiconductor wafer 100, according to various embodiments, wherein the semiconductor wafer 100 may include a semiconductor body 102 and an integrated circuit structure 104, wherein the semiconductor body 102 and/or the integrated circuit structure 104 may include one or more structure elements 104s (e.g. as part of a transistor structure or as part of a resistance, capacity or inductance), wherein the tetrahedral amorphous carbon layer 106 may be disposed over the one or more structure elements 104s. According to various embodiments, the tetrahedral amorphous carbon layer 106 may cover the one or more structure elements 104s and may fill for example a space between adjacent structure elements 104s. Further, according to various embodiments, the tetrahedral amorphous carbon layer 106 may conformally cover the one or more structure elements 104s, e.g. such that a space between adjacent structure elements 104s may be partially filled.

Illustratively, the tetrahedral amorphous carbon layer 106 may conformally cover the wafer 100, the semiconductor body 102 and/or the integrated circuit structure 104.

Various modifications and/or configurations of the semiconductor wafer 100 and details referring to the tetrahedral amorphous carbon layer 106 are described in the following, wherein the features and/or functionalities described referring to FIGS. 2A to 2E may be included analogously. Further, the features and/or functionalities described in the following may be included in the semiconductor wafer 100 or may be combined with the semiconductor wafer 100, as described before referring to FIGS. 2A to 2E.

Figure 3:
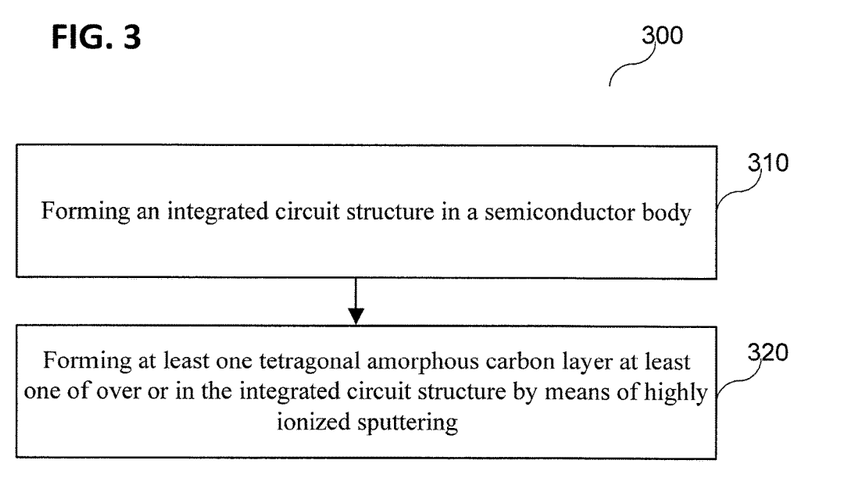
FIGS. 3 and 4 respectively show a method for processing a semiconductor wafer in a flow diagram, according to various embodiments.

FIG. 3 illustrates a schematic flow diagram of a method 300 for processing a semiconductor wafer 100, wherein the method 300 may include: in 310, forming an integrated circuit structure 104 in a semiconductor body 102; and, in 320, forming at least one tetrahedral amorphous carbon layer 106 at least one of over or in the integrated circuit structure 104 by means of highly ionized sputtering (HIS).

Figure 5:
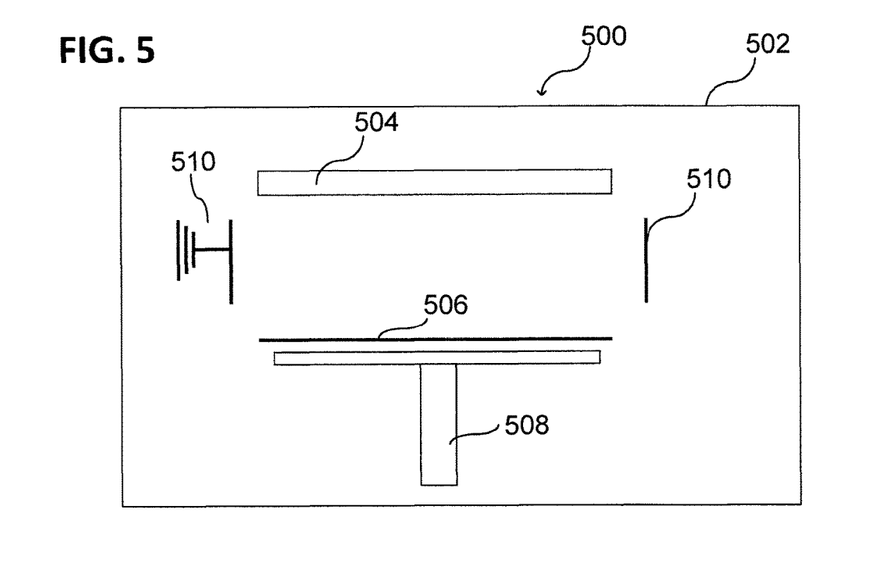
FIG. 5 shows a schematic view of a sputtering system for forming a tetrahedral amorphous carbon layer, according to various embodiments.
Figure 6:
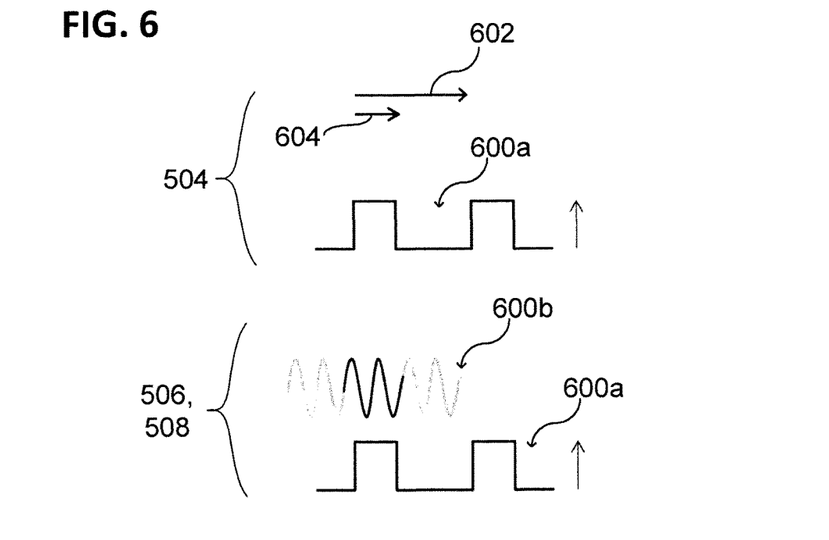
FIG. 6 schematically illustrates details of a method for operating a sputtering system to form a tetrahedral amorphous carbon layer, according to various embodiments.

According to various embodiments, the tetrahedral amorphous carbon layer 106 may be formed by using a sputtering system, e.g. a magnetron sputtering system, operated in high energy pulsed mode, cf. FIGS. 5 and 6. Illustratively, sputtering system may be configured and operated as a high power impulse magnetron sputtering (HiPIMS) system, e.g. also known as high-power pulsed magnetron sputtering (HPPMS).

According to various embodiments, the sputtering system may be configured and operated such that the carbon layer being deposited may include a substance amount fraction of $sp^3$-hybridized carbon of larger than 0.4 and a substance amount fraction of hydrogen smaller than 0.1, as already described.

According to various embodiments, one or more than one DLC layer may be deposited over the semiconductor body 102 via HiPIMS. Thereby, the layers may differ from each other, since the sputtering system may be configured and operated such that various types of DLC layers can be formed. According to various embodiments, the substance amount fraction of $sp^3$-hybridized carbon may be controlled by controlling the deposition parameters, e.g. the voltage applied at the cathode or the bias voltage at the semiconductor wafer, e.g. the substrate temperature during deposition, and the substance amount fraction of hydrogen may be controlled by inserting hydrogen as process gas during the deposition.

According to various embodiments, the tetrahedral amorphous carbon layer 106 may be formed under vacuum conditions in a first hydrogen partial pressure, e.g. in an atmosphere being substantially free of hydrogen, and the at least one additional amorphous carbon layer 106a is formed under vacuum conditions in a second hydrogen partial pressure different from the first hydrogen partial pressure.

According to various embodiments, a thermal treatment may be carried out after at least the tetrahedral amorphous carbon layer 106 is formed on the wafer, wherein the semiconductor wafer and the tetrahedral amorphous carbon layer 106 are subjected to a temperature of larger than about 400° C., e.g. the semiconductor body 102 and the tetrahedral amorphous carbon layer 106 may be annealed at a temperature in the range from about 400° C. to about 1200° C. The annealing of the semiconductor wafer may be necessary for example to activate an ion implant or to perform a doping process (e.g. thermally diffusing doping material in the semiconductor body 102 or in the integrated circuit structure 104).

According to various embodiments, a heat treatment or an annealing may be applied for forming an electronic structure over or in the semiconductor body. A heat treatment or an annealing may be included in various processes (or at various process stages) during manufacture of an electronic structure or during processing a wafer, as described herein, e.g. in combination with a patterning process, after applying photoresist, and/or after depositing electrical contacts to alloy the electrically conductive material (e.g. a metal) with a carrier (or with the subjacent structure), or to provide optimal deposition conditions for a layering process. The heating of a wafer (a carrier, a substrate, and the like) may be performed with direct contact, e.g. a hot plate, or by radiation, e.g. using a laser or lamps. A rapid thermal processing (RTP) may be applied, which may be performed under vacuum conditions using a laser heater or lamp heater, wherein a material (e.g. a wafer, a substrate, a carrier, and the like) may be heated up to several hundred degrees Celsius or up to about 1200° C. or even greater within a short time period, e.g. within several seconds (e.g. about 1 s to about 20 s). Subsets of rapid thermal processing are rapid thermal annealing (RTA) and rapid thermal oxidation (RTO).

According to various embodiments, at least one additional layer may be formed over the at least one tetrahedral amorphous carbon layer 106, e.g. for manufacturing an electronic device, and subsequently a chemical mechanical polishing (CMP) process may be carried out, wherein the additional layer is at least partially removed. In other words, the tetrahedral amorphous carbon layer 106 may be integrated into the electronic circuit structure 104 as a CMP-stop layer.

Figure 4:
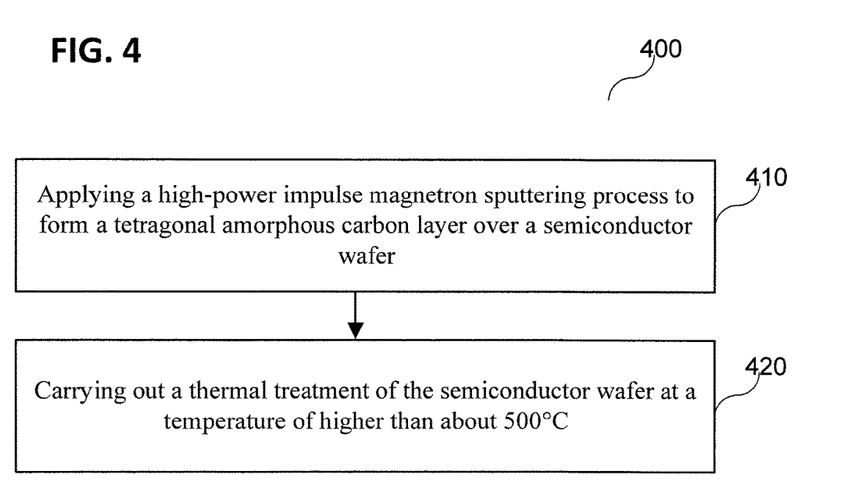

FIG. 4 illustrates a schematic flow diagram of a method 400 for processing a semiconductor wafer 100, wherein the method 400 may include: in 410, applying a high-power impulse magnetron sputtering process to form a tetrahedral amorphous carbon layer over a semiconductor wafer; and, in 420, subsequently carrying out a thermal treatment of the semiconductor wafer at a temperature of higher than about 500° C.

According to various embodiments, details referring to the HIS (the power impulse magnetron sputtering process) and the sputtering system may be described in the following.

FIG. 5 illustrates a sputtering system 500 in a schematic view, according to various embodiments. The sputtering system 500 may be configured as magnetron sputtering system including a process chamber 502, a sputter target 504 (e.g. a pure carbon target), a wafer chuck 508 for mounting a wafer 506 in the process chamber 502, and a shielding 510. Further, according to various embodiments, the sputtering system 500 may include a power supply or more than one power supply to provide power for the cathode and to provide a bias voltage at the wafer 506 or wafer chuck 508. According to various embodiments, the process chamber 502 may be a vacuum deposition chamber configured to provide a vacuum for performing a PVD process, e.g. a sputtering process.

As schematically shown in FIG. 6, a pulsed DC power 600a (current and/or voltage) may be applied to the carbon target 504, such that a plasma (e.g. argon plasma) can be provided within the process chamber 502, wherein the carbon target 504 acts as a cathode and carbon ions may be sputtered from the target 504 due to the generated plasma. The power (e.g. the voltage and the current) may be provided such that carbon ions may be generated during the sputtering process. Further, a negative bias voltage may be applied to the wafer 506 or the wafer chuck 508 such that the carbon ions generated in the plasma may be accelerated into the direction of the wafer 506. As a result, a ta-C layer may be deposited on the wafer 506. The process chamber 502 may be to the extent as possible free of hydrogen, such that a ta-C layer can be deposited including a small amount of hydrogen, as described before.

According to various embodiments, the deposition parameters may be selected and/or adapted such that an average ion energy of the carbon ions sputtered in the high-power impulse magnetron sputtering system may be in the range from about 40 eV per ion to about 1 keV per ion or to about several kilo electron volts per ion, e.g. in the range from about 60 eV per ion to about 5 keV per ion, e.g. in the range from about 60 eV per ion to about 3 keV per ion, e.g. in the range from about 60 eV per ion to about 1 keV per ion (e.g. in contrast to about 2 eV to 10 eV per ion in conventional sputtering).

According to various embodiments, the negative bias voltage applied on the wafer 506 or the wafer chuck 508 may be an RF-voltage (e.g. at 13.56 MHz) provided by an RF-power source. Alternatively, a DC power source or a pulsed DC power source may be utilized, e.g. controlled by power or voltage.

According to various embodiments, the highly ionized sputtering (HIS) may include pulsed DC-sputtering with high power, as already described. Alternatively, the highly ionized sputtering (HIS) may include pulsed RF-sputtering with high power. Moreover, the highly ionized sputtering (HIS) may include reactive sputtering, wherein for example hydrogen may be introduced into the process chamber 502 during deposition. Illustratively, the sputtering process may be configured to provide carbon ions in the generated plasma, which may be correlated with generating $sp^3$-hybridized carbon in the tetrahedral amorphous carbon layer 106.

According to various embodiments, the negative bias voltage may be in the range from about 20 V to about 140 V (or to about 1 kV), e.g. in the range from about 40 V to about 120 V, in the range from about 60 V to about 100 V. According to various embodiments, the high-power impulse magnetron sputtering is performed such that carbon ions sputtered from a cathodic target precipitate or condense at a surface of the semiconductor wafer.

According to various embodiments, the semiconductor wafer 506 may be cooled during the deposition process, such that the temperature of the semiconductor wafer 506 may for example not exceed about 150° C. during the deposition process. Further, the semiconductor wafer 506 may be heated in order to control the $sp^2$ to $sp^3$ ratio, e.g. for stress engineering.

It has to be noted, that in a conventional magnetron sputtering process the power density is too low to generate a significant amount of ions of the target material, since a continuous discharge may be limited in the power due to the thermal load on the target, since most of the ion bombarding energy is transformed into heat at the target. Therefore, a HIS process may include a pulsed sputtering deposition with a high maximal power and a thermally acceptable average power.

Referring to this, the high degree of ionization of the sputtered material and the high plasma density in a HIS process may lead to an improved layer morphology, a higher density which may result in a higher mechanical stability of the deposited carbon layer, and improved adhesion of the deposited carbon layer, a higher refraction index of the deposited carbon layer, and/or improved diffusion bather properties of the deposited carbon layer.

According to various embodiments, optical refraction index of the deposited ta-C carbon layer 106 may be in the range from about 2.1 to about 2.4 (at a wavelength in the visible spectrum of light). Further, the deposited ta-C carbon layer 106 may be optical transparent (e.g. the transmittance may be larger than 80%) in the range of the visible light, the infrared light an ultraviolet light with a wavelength longer than 225 nm.

According to various embodiments, the (specific) thermal conductivity of the deposited ta-C carbon layer 106 may be in the range from about 500 W/(m K) to about 2000 W/(m K). Therefore, the ta-C carbon layer 106 may be used as heat sink layer in the integrated circuit structure 104.

According to various embodiments, the deposited ta-C carbon layer 106 may be deposited via a modified HiPIMS process, e.g. via burst HiPIMS or modulated pulse power (MPP) sputtering. Accordingly, a mid frequency (MF) discharge may be superposed to the discharge or may be applied in between the HiPIMS pulses.

According to various embodiments, the (specific) electrical conductivity of the deposited ta-C carbon layer 106 (e.g. the undoped DLC layer) may be in the range from about $10^7$ $\Omega$cm to about $10^{15}$ $\Omega$cm. Therefore, the ta-C carbon layer 106 may be used electrically isolating layer in the integrated circuit structure 104. According to various embodiments, the ta-C carbon layer 106 may be used as electrically insulating heat sink layer in the integrated circuit structure 104. Further, the ta-C carbon layer 106 may be used as semi-insulating layer or electroactive passivation (e.g. due to so-called Poole Frenckel conduction mechanism).

As illustrated in FIG. 6, the power pulse 600a may have a duration 604 and a period time of 602, which may be selected to provide an on-time ratio in the range from about 1% to about 10%, e.g. depending on the pulse duration 604 and the repetition rate (frequency) which may be in the range from about 1 Hz to about several kHz.

According to various embodiments, the bias voltage 600b applied at the wafer during the deposition process may be a DC-voltage, an MF-voltage (e.g. 0 kHz to 350 kHz), or a HF-voltage (e.g. an RF-voltage at about 13.6 MHz). Further, according to various embodiments, the power generating the plasma may be provided in a pulsed mode, as already described, wherein the pulse duration may be in the range from about 10 µs to about 200 µs, with a power larger in the range of megawatts at typically used target sizes, e.g. a current may be applied of larger than about 500 A at voltage of about 1 kV.

According to various embodiments, a semiconductor wafer 100 may include: a semiconductor body 102 including an integrated circuit structure 104; at least one tetrahedral amorphous carbon layer 106 formed at least one of over or in the integrated circuit structure 104, wherein the at least one tetrahedral amorphous carbon layer include a substance amount fraction of $sp^3$-hybridized carbon of larger than approximately 0.4 and a substance amount fraction of hydrogen smaller than approximately 0.1. In other words, the at least one tetrahedral amorphous carbon layer may include 40 at-% of $sp^3$-hybridized carbon and less than 10 at-% of hydrogen. According to various embodiments, the hydrogen atoms may be bonded to the carbon atoms or the hydrogen atoms may be incorporated into the tetrahedral amorphous carbon layer.

According to various embodiments, the tetrahedral amorphous carbon layer may partially cover the semiconductor wafer, e.g. the semiconductor body 102 and/or the integrated circuit structure 104. Alternatively, according to various embodiments, the tetrahedral amorphous carbon layer may completely cover the semiconductor wafer, e.g. the semiconductor body 102 and/or the integrated circuit structure 104.

According to various embodiments, the tetrahedral amorphous carbon layer may be patterned or partially patterned via a lithographic patterning process used in semiconductor industry.

According to various embodiments, the tetrahedral amorphous carbon layer may be disposed between a first region 104a of the integrated circuit structure and a second region 104b of the integrated circuit structure. Accordingly, the tetrahedral amorphous carbon layer may laterally separate, e.g. spatially separate or electrically separate (isolate), two adjacent regions of the integrated circuit structure. Accordingly, the tetrahedral amorphous carbon layer may vertically separate, e.g. spatially separate or electrically separate (isolate), two adjacent regions of the integrated circuit structure.

According to various embodiments, the tetrahedral amorphous carbon layer may be disposed between a first region of the integrated circuit structure and a second region of the integrated circuit structure to electrically isolate the first region from the second region of the integrated circuit structure. According to various embodiments, the specific electrical resistance of the tetrahedral amorphous carbon of the tetrahedral amorphous carbon layer may be in the range from about $10^6$ $\Omega$cm to about $10^{15}$ $\Omega$cm.

According to various embodiments, the tetrahedral amorphous carbon layer may connect at least a part of the integrated circuit structure to a heat sink structure to dissipate heat from the integrated circuit structure. According to various embodiments, the thermal conductivity of the tetrahedral amorphous carbon of the tetrahedral amorphous carbon layer may be larger than about 400 W/(m*K) or larger than 1000 W/(m*K).

According to various embodiments, the tetrahedral amorphous carbon layer is doped with metal, e.g. with boron, aluminum, silicon, nitrogen, silver, tungsten, phosphorous, arsenic, gallium, indium, or other metals or materials being suitable for doping carbon. Further, according to various embodiments, the tetrahedral amorphous carbon layer may include a metal carbide or a semi-metal carbide, e.g. chromium carbide, silicon carbide, tungsten carbide, e.g. depending on the amount of material added to the carbon and depending on the process conditions. According to various embodiments, dopants, such as silicon or tungsten, may be introduced into the carbon layer via sputtering, while carbon may be added from the gaseous phase.

According to various embodiments, a method for processing a semiconductor wafer may include: forming an integrated circuit structure in a semiconductor body; and forming at least one tetrahedral amorphous carbon layer at least one of over or in the integrated circuit structure by means of highly ionized sputtering.

According to various embodiments, the highly ionized sputtering may be configured such that the at least one tetrahedral amorphous carbon layer includes a substance amount fraction of $sp^3$-hybridized carbon of larger than 0.4 and a substance amount fraction of hydrogen smaller than 0.1.

According to various embodiments, the substance amount fraction may also be referred to as molar fraction or molar proportion.

According to various embodiments, the method for processing a semiconductor wafer may further include: forming at least one additional amorphous carbon layer at least one of over or in the integrated circuit structure by means of highly ionized sputtering, wherein at least one of a substance amount fraction of $sp^3$-hybridized carbon of the at least one additional amorphous carbon layer or a substance amount fraction of hydrogen of the at least one additional amorphous carbon layer is different from that of the at least one tetrahedral amorphous carbon layer.

According to various embodiments, wherein the at least one additional amorphous carbon layer and the at least one tetrahedral amorphous carbon layer are formed via the very same sputtering system, e.g. via a high-power pulsed magnetron sputtering system.

According to various embodiments, the at least one tetrahedral amorphous carbon layer is formed under vacuum conditions in a first hydrogen partial pressure and the at least one additional amorphous carbon layer is formed under vacuum conditions in a second hydrogen partial pressure different from the first hydrogen partial pressure.

According to various embodiments, the method for processing a semiconductor wafer may further include: forming an electronic structure at least one of over or in the semiconductor wafer.

According to various embodiments, the method for processing a semiconductor wafer may further include: carrying out a thermal treatment or an annealing of the semiconductor wafer at a temperature of larger than about 500° C.

According to various embodiments, the method for processing a semiconductor wafer may further include: forming at least one additional layer over the at least one tetrahedral amorphous carbon layer and performing a chemical mechanical polishing at least partially removing the additional layer exposing the at least one tetrahedral amorphous carbon layer at least partially.

According to various embodiments, a method (for processing a wafer) may include: applying a high-power impulse magnetron sputtering process or a high-power pulsed magnetron sputtering to form a tetrahedral amorphous carbon layer over a semiconductor wafer; and subsequently carrying out a thermal treatment of the semiconductor wafer at a temperature of higher than about 500° C. According to various embodiments, the high-power impulse magnetron sputtering process or the high-power pulsed magnetron sputtering may be performed in a hydrogen free atmosphere, e.g. under vacuum conditions with an accordingly very small hydrogen partial pressure.

According to various embodiments, the method may further include forming an electronic structure at least one of over or in the semiconductor wafer.

According to various embodiments, an average ion energy (e.g. the kinetic energy) of the carbon ions sputtered in the high-power impulse magnetron sputtering may be in the range from about 40 eV per ion to about 5 keV per ion, e.g. in the range from about 40 eV per ion to about 2 keV per ion, e.g. in the range from about 40 eV per ion to about 1 keV per ion, e.g. in the range from about 40 eV per ion to about 140 eV per ion.

According to various embodiments, a negative bias voltage may be applied to the semiconductor wafer during the high-power impulse magnetron sputtering and/or to a wafer chuck carrying the semiconductor wafer during the high-power impulse magnetron sputtering.

According to various embodiments, the negative bias voltage may be an RF-voltage provided by an RF-power source, the RF-voltage oscillating around an offset value. According to various embodiments, the negative bias voltage (or the offset value) may be in the range from about 20 V to about 140 V (e.g. the peak amplitude of the RF-Voltage).

According to various embodiments, the high-power impulse magnetron sputtering or the high-power pulsed magnetron sputtering may be configured such that carbon ions sputtered from a cathodic target precipitate at a surface of the semiconductor wafer.

The highly ionized sputtering (e.g. the high-power impulse magnetron sputtering or the high-power pulsed magnetron sputtering) may be implemented into the environment of semiconductor fabrication, which may require a clean processing environment with a low (dust) particle density. During processing, particles (which may not contribute to the film growth of the carbon layer, e.g. large particles or flakes) may be ejected from the chamber walls of the processing chamber, from the anode, and/or from the cathode (the target). According to various embodiments, a chamber cleaning process may be carried out for cleaning the processing chamber before a highly ionized sputtering process is performed in the processing chamber, during a highly ionized sputtering (e.g. the sputtering may be suspended) is performed in the processing chamber, and/or after a highly ionized sputtering process has been performed in the processing chamber. Without such a cleaning process, particles may be formed due to delamination of carbon (e.g. carbon flakes or ta-C flakes) from the chamber walls of the processing chamber (in contrast to pure metals, the adhesion of carbon on components of the processing chamber may be small), wherein such particles or flakes may disturb the growth of the carbon layer or may affect the film properties of the grown carbon layer. According to various embodiments, cleaning the processing chamber may include providing a plasma being able to chemically remove carbon from the chamber walls and from the anode during or in between a deposition process. Therefore, oxygen may be provided in the processing chamber for cleaning the chamber via an oxygen plasma, wherein carbon may be oxidized to gaseous carbon oxide. Further, the target (e.g. including carbon) may be protected during the cleaning process (e.g. a shutter may be provided inhibiting plasma erosion).

Furthermore, according to various embodiments, pyrolithic carbon may be used as target material (alternatively to pressed carbon targets) for the highly ionized sputtering, thereby providing a lower particle generation during sputtering.

According to various embodiments, a method for processing a semiconductor wafer may include a cleaning process for a processing chamber in which the highly ionized sputtering is carried out. According to various embodiments, the cleaning process may include providing a plasma inside the processing chamber to chemically remove carbon from a surface within the processing chamber, e.g. from the walls of the processing chamber or from a component within the processing chamber, e.g. from an anode provided in the processing chamber.

According to various embodiments, the substance amount fraction may refer to the mole percentage or atomic percentage, which is also referred to as mole fraction or amount fraction (the amount of substance refers to the SI unit mole (SI: International System of Units)).

According to various embodiments, at least one gas of the following group of gases may be used in the cleaning process in order to remove carbon, the group including: oxygen or an oxygen containing gas, e.g. $N_2O$ or any other gas forming reactive oxygen in a plasma (e.g. a DC plasma, pulsed DC plasma, or RF plasma). According to various embodiments, the plasma may be ignited and sustained during the cleaning process via an additional power supply and an additional cathode, the cathode may be for example electrically connected to the power supply to provide an electrical field for generating the plasma. According to various embodiments, the plasma may be ignited and sustained during the cleaning process via a chuck and a coated shielding powered as cathode. According to various embodiments, if a process uses a carbon target in the processing chamber to be cleaned, the target can be protected (e.g. covered or partially covered) by a shield (e.g. by a conductive shield or by a movable shutter).

According to various embodiments, the cleaning process may include introducing $O_3$ into the processing chamber to be cleaned, wherein the $O_3$ may be generated via an external $O_3$ source.

According to various embodiments, at least one gas of the following group of gases may be used in the cleaning process in order to remove carbon (e.g. additionally to oxygen or the oxygen containing gas), the group including: fluorine or a fluorine containing gas, e.g. $NF_3$, $C_2F_6$, $CF_4$. According to various embodiments, a reactive fluorine gas supply may be required for removing silicon doped carbon or silicon doped carbon films. According to various embodiments, the fluorine gas may be introduced via a remote plasma source.

According to various embodiments, a shutter may cover the target during the cleaning process. Further, the shutter may not cover the surrounding parts (e.g. the anode). Therefore, according to various embodiments, the shutter may be moveable in plane of the target and perpendicular to the target plane in order to cover the target precisely.

According to various embodiments, a method for processing a carrier (e.g. a wafer or a semiconductor wafer) may include: performing a cleaning process to remove a carbon contamination from the inside of a processing chamber of a sputter deposition system, and performing a sputter deposition by means of the sputter deposition system to form at least one carbon layer over a carrier.

According to various embodiments, the method for processing the carrier may further including: covering a carbon target in the processing chamber with a shutter during the cleaning process. According to various embodiments, the carbon target may be used for the sputter deposition of the at least one carbon layer.

Further, according to various embodiments, performing the cleaning process may include providing a plasma within the processing chamber. According to various embodiments, the plasma may be provided via a remote plasma source. According to various embodiments, the plasma may be provided via an additional anode and an additional cathode provided in the processing chamber. The additional anode and the additional cathode may be configured (e.g. coupled to a DC- or RF-power source) to provide a plasma in the processing chamber for the cleaning.

According to various embodiments, the plasma may be provided from fluorine gas or from a fluorine containing gas. According to various embodiments, the plasma may be provided from oxygen or from an oxygen containing gas.

According to various embodiments, performing the cleaning process may include providing ozon in the processing chamber.

According to various embodiments, performing the cleaning process may further include heating the processing chamber, e.g. up to a temperature in the range from about 100° C. to about 300° C.

According to various embodiments, the sputter deposition may be performed by means of highly ionized sputtering to form at least one tetrahedral amorphous carbon layer over the carrier.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method for processing a semiconductor wafer, the method comprising:
    forming an integrated circuit structure in a semiconductor body;
    forming at least one tetrahedral amorphous carbon layer at least one of over or in the integrated circuit structure by means of highly ionized sputtering, wherein the highly ionized sputtering is configured such that the at least one tetrahedral amorphous carbon layer comprises a substance amount fraction of sp3 hybridized carbon of larger than 0.4 and a substance amount fraction of hydrogen smaller than 0.1; and
    forming at least one additional layer over the at least one tetrahedral amorphous carbon layer and performing a chemical mechanical polishing at least partially removing the additional layer exposing the at least one tetrahedral amorphous carbon layer at least partially.

2. The method according to claim 1, further comprising:
    forming an electronic structure at least one of over or in the semiconductor wafer.

3. The method of claim 1,
    wherein the highly ionized sputtering comprises sputtering carbon atoms with an average ion energy in the range from about 40 eV per ion to about 5 keV per ion.

4. The method of claim 1, wherein the highly ionized sputtering is performed using a high-power impulse magnetron sputtering process.

5. The method of claim 1, wherein the at least one tetrahedral amorphous carbon layer is directly on the integrated circuit structure.

6. A method for processing a semiconductor wafer, the method comprising:
    forming an integrated circuit structure in a semiconductor body;
    forming at least one tetrahedral amorphous carbon layer at least one of over or in the integrated circuit structure by means of highly ionized sputtering, wherein the highly ionized sputtering is configured such that the at least one tetrahedral amorphous carbon layer comprises a substance amount fraction of sp3 hybridized carbon of larger than 0.4 and a substance amount fraction of hydrogen smaller than 0.1; and
    forming at least one additional amorphous carbon layer at least one of over or in the integrated circuit structure by means of highly ionized sputtering, wherein at least one of a substance amount fraction of sp3 hybridized carbon of the at least one additional amorphous carbon layer or a substance amount fraction of hydrogen of the at least one additional amorphous carbon layer is different from the at least one tetrahedral amorphous carbon layer.

7. The method according to claim 6,
    wherein the at least one additional amorphous carbon layer and the at least one tetrahedral amorphous carbon layer are formed via the very same sputtering system.

8. The method according to claim 7,
wherein the at least one tetrahedral amorphous carbon layer is formed under vacuum conditions in a first hydrogen partial pressure and the at least one additional amorphous carbon layer is formed under vacuum conditions in a second hydrogen partial pressure different from the first hydrogen partial pressure.

9. A method for processing a semiconductor wafer, the method comprising:
forming an integrated circuit structure in a semiconductor body;
forming at least one tetrahedral amorphous carbon layer at least one of over or in the integrated circuit structure by means of highly ionized sputtering, wherein the highly ionized sputtering is configured such that the at least one tetrahedral amorphous carbon layer comprises a substance amount fraction of sp3 hybridized carbon of larger than 0.4 and a substance amount fraction of hydrogen smaller than 0.1; and
carrying out a thermal treatment of the semiconductor wafer at a temperature of larger than about 400° C.

* * * * *